(12) United States Patent
Lemczyk et al.

(10) Patent No.: US 10,126,359 B2
(45) Date of Patent: Nov. 13, 2018

(54) FREE PISTON STIRLING COOLER TEMPERATURE CONTROL SYSTEM FOR SEMICONDUCTOR TEST

(71) Applicant: SENSATA TECHNOLOGIES, Attleboro, MA (US)

(72) Inventors: Thomas F. Lemczyk, Phoenix, AZ (US); David L. Weston, Peoria, AZ (US); Christopher A. Lopez, Phoenix, AZ (US); Richard A. Davis, Peoria, AZ (US)

(73) Assignee: Sensata Technologies, Attleboro, MA (US)

( * ) Notice: Subject to any disclaimer, the term of this patent is extended or adjusted under 35 U.S.C. 154(b) by 179 days.

(21) Appl. No.: 15/404,650

(22) Filed: Jan. 12, 2017

(65) Prior Publication Data

US 2018/0196102 A1    Jul. 12, 2018

(51) Int. Cl.
*G01R 31/28* (2006.01)
*F25B 9/14* (2006.01)
*F25D 19/00* (2006.01)

(52) U.S. Cl.
CPC ............ *G01R 31/2891* (2013.01); *F25B 9/14* (2013.01); *F25D 19/00* (2013.01); *F25B 2309/001* (2013.01)

(58) Field of Classification Search
CPC ....... F25D 19/00; F25B 9/14; F25B 2309/001
See application file for complete search history.

(56) References Cited

U.S. PATENT DOCUMENTS

| 5,531,074 | A | 7/1996 | Katagiri et al. |
| 5,552,609 | A | 9/1996 | Katagiri |
| 5,749,226 | A * | 5/1998 | Bowman ............... F02G 1/0435 257/E23.096 |
| 2005/0040812 | A1* | 2/2005 | Holt ........................ B25J 9/041 324/756.01 |
| 2006/0139046 | A1* | 6/2006 | Lape ................... G01R 31/2867 324/750.14 |

FOREIGN PATENT DOCUMENTS

KR    100801677 B1    2/2008

OTHER PUBLICATIONS

Combined Search and Examination Report from related GB Application No. GB1721282.0, dated Jun. 20, 2018.

* cited by examiner

*Primary Examiner* — Giovanni Astacio-Oquendo
*Assistant Examiner* — Alvaro Fortich
(74) *Attorney, Agent, or Firm* — Burns & Levinson, LLP; Joseph M. Maraia

(57) ABSTRACT

A portable cooling system and apparatus for semiconductor device testing includes a free piston Stirling cooler. This eliminates the need for cumbersome remotely located equipment, such as a chillers, compressors, coolant storage equipment, hoses and hose connections. An electrical power line and an air supply line are routed from a head control unit to a portable system control unit. The head control unit is positioned by an adjustable frame structure to locate the Stirling cooler vertically directly over a semiconductor device under test. The head control unit includes a thermal adapter system, which is configured between the free piston Stirling cooler and the semiconductor device under test.

16 Claims, 4 Drawing Sheets

FREE PISTON STIRLING COOLER TEMPERATURE CONTROL SYSTEM FOR SEMICONDUCTOR TEST

FIELD OF TECHNOLOGY

The present disclosure relates to the field of refrigeration and cooling systems and more particularly to systems for controlling the temperature of semiconductor devices during automated testing.

BACKGROUND

Previously existing temperature control systems used in the semiconductor test industry to control the temperature of a semiconductor device under test include phase change direct refrigeration systems that use coolants such as air, water, ethylene-glycol mixtures, and other special heat transfer fluids. In these systems, a chiller refrigerant unit is generally used to secondarily control the temperature of a principal coolant fluid. Some previously existing temperature control systems include direct refrigerant cooling systems, which use the primary refrigerant directly as the principal coolant fluid.

The phase change direct refrigeration systems and even the direct refrigerant cooling systems used in existing temperature control systems for semiconductor testing involve the use of cumbersome and complex components such as a remote compressors, evaporators, cold plate components and chassis hardware. Moreover, previously existing cooling systems for semiconductor test are generally configured to be located remotely from a semiconductor device under test. These systems generally locate bulk coolant controller hardware remotely from the semiconductor device under test and involve routing of an umbilical line which provides a flow of coolants, air and electrical power to a head control unit (HCU). This involves the use of numerous hoses and hose corrections for transporting refrigerants and increases risk of refrigerant leakage.

SUMMARY

Aspects of the present disclosure include a portable cooling system and apparatus for semiconductor device testing. The disclosed portable cooling system is based on a free piston Stirling cooler, rather than a traditional coolant based cooling system.

The use of a free piston Stirling cooler in the disclosed portable cooling system and apparatus eliminates the need for cumbersome remotely located equipment, such as a chillers, compressors, coolant storage equipment, hoses and hose connections, which are used in traditional semiconductor cooling systems. The disclosed system does not involve equipment that is typically used to control temperature for a primary coolant in a typical existing semiconductor cooling system and does not require a thermoelectric cooler device that is typically used in previously existing standard refrigerant systems to reduce temperatures at the semiconductor device under test below typical refrigerant coolant temperatures in order to achieve temperatures below −40C., for example. In the disclosed portable cooling system and apparatus, only an electrical power line and air supply line are routed from the HCU to a portable system control unit (SCU).

By eliminating much of the cumbersome hardware used in traditional semiconductor cooling systems, the disclosed portable cooling system and apparatus can be configured to be located in close or direct proximity to a semiconductor device under test. The disclosed system and apparatus readily provides extremely low contact temperatures to less than −100° C. at the semiconductor device under test. This addresses industry goals for testing semiconductor devices at temperatures below −70C.

Aspects of the present disclosure also include an FSPC thermal adapter system that incorporates key features specifically for semiconductor test applications. For example, embodiments of the disclosed thermal adapter system includes an adaptive thermal clutch pressure apparatus to allow controlled heating as well as controlled cooling of a semiconductor device under test. Embodiments of the disclosed thermal adapter system also allow automatic pressure actuation with the SDUT.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Aspects of the present disclosure include a portable free piston Stirling cooler (FPSC) system for semiconductor device testing. Free piston Stirling coolers and their inherent principals operation are well known in the fields of cryogenics and thermodynamics. The free piston Stirling cooler is a closed system utilizing non-phase changing, environmentally friendly gas such as nitrogen or helium. This eliminates use of specialized heat transfer fluids and associated special chiller/compressors and components.

The disclosed portable FPSC system is configured to be entirely located near a semiconductor device under test. In an illustrative embodiment, a free piston Stirling cooler is included in a head control unit (HCU) that is suspended directly above the semiconductor device under test. A portable system control unit is conveniently located on a mounting structure near the semiconductor device under test and the HCU. An electrical power line and an air supply line is coupled between the portable system control unit and the HCU.

The disclosed FPSC system can achieve cooling of semiconductor device under test to substantially lower temperatures than previously existing systems for cooling semiconductor devices under test. Embodiments of the disclosed system provide cooling of semiconductor devices to temperatures below −100° C. for testing, for example.

Figure 1:
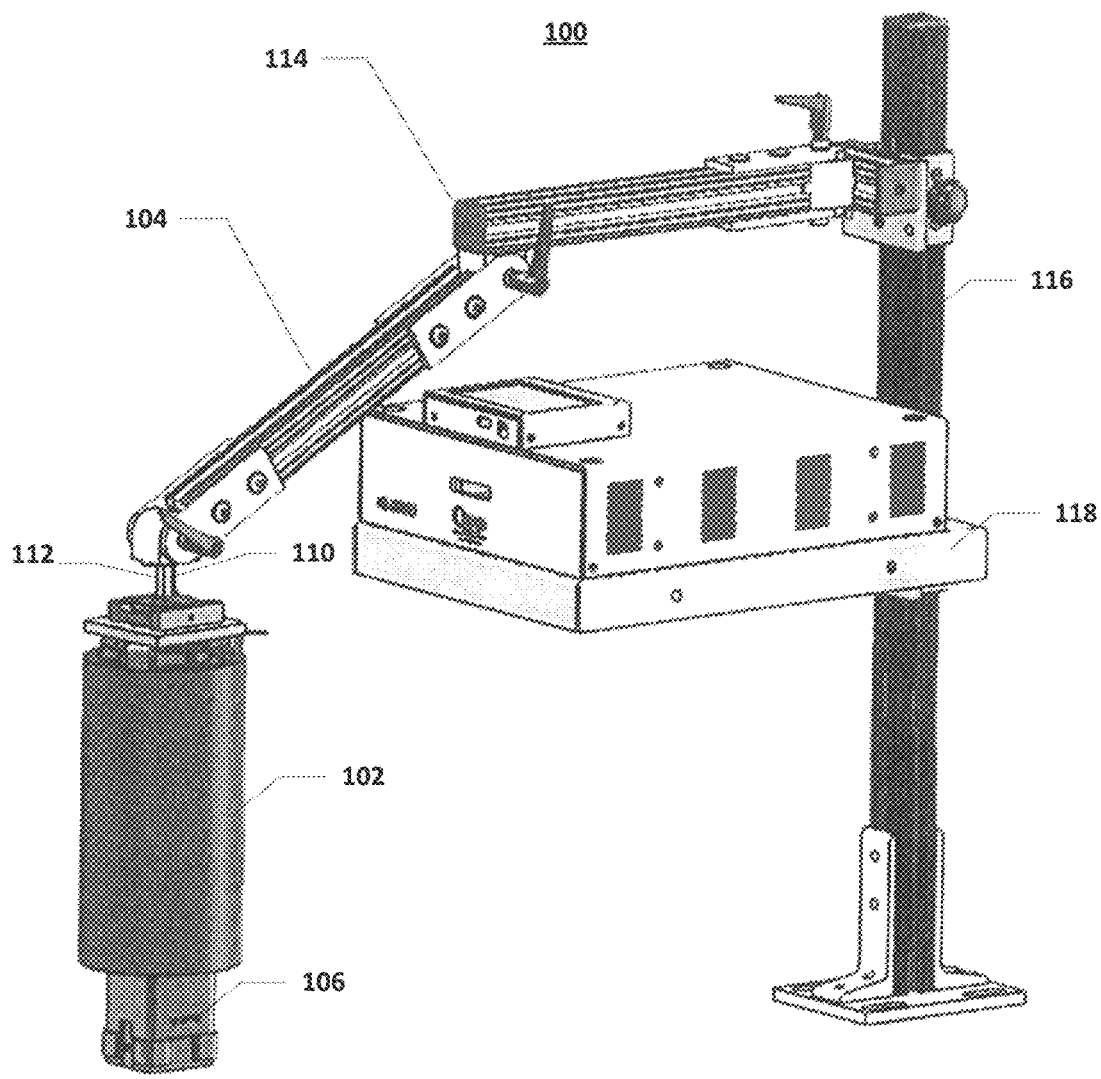
FIG. 1 is an illustration of a portable semiconductor cooling apparatus according to an aspect of the present disclosure.

An illustrative embodiment of a portable semiconductor cooling apparatus according to an aspect of the present disclosure is described with respect to FIG. 1. The portable semiconductor cooling apparatus 100 includes a free piston Stirling cooler (FPSC) 102 and a support member 104 configured for locating the FPSC directly over a semiconductor device under test in a vertical orientation. According to an aspect of the present disclosure, a thermal adapter 106 is coupled to the FPSC 102 and configured for coupling to the semiconductor device under test.

In the illustrative embodiment, a portable system control unit 108 is coupled to the free piston Stirling cooler 102. An electrical power line 110 extends between the portable system control unit and the FPSC. An air supply line 112 also extends between the portable system control unit 108 and the FPSC 102. The electrical power 110 line and the air supply line 112 are supported by the support member 104.

According to an aspect of the present disclosure, the disclosed portable semiconductor cooling apparatus 100 includes an adjustable support frame 114 including the support member 104. The adjustable support frame 114 is configured for locating and orienting the FPSC 102 in a fixed location proximate to the semiconductor device under test. The adjustable support frame 114 may include one or more articulating arms, such as support member 104, pivitably attached to each other and configured to be latched, locked or clamped in a desired orientation for locating the FPSC 102. In the illustrative embodiment, the FPSC 102 is suspended vertically above the semiconductor under test.

A support frame base 116 is adjustably coupled to the adjustable support frame 114. The support frame base 116 includes a system control unit support structure 118. A system control unit 108 is supported by the system control unit support structure 118. In an illustrative embodiment, the electrical power line 110 and the air supply line 112 extend from the FPSC 102 to the system control unit 108 via a cable path within the adjustable support frame 114.

Figure 2:
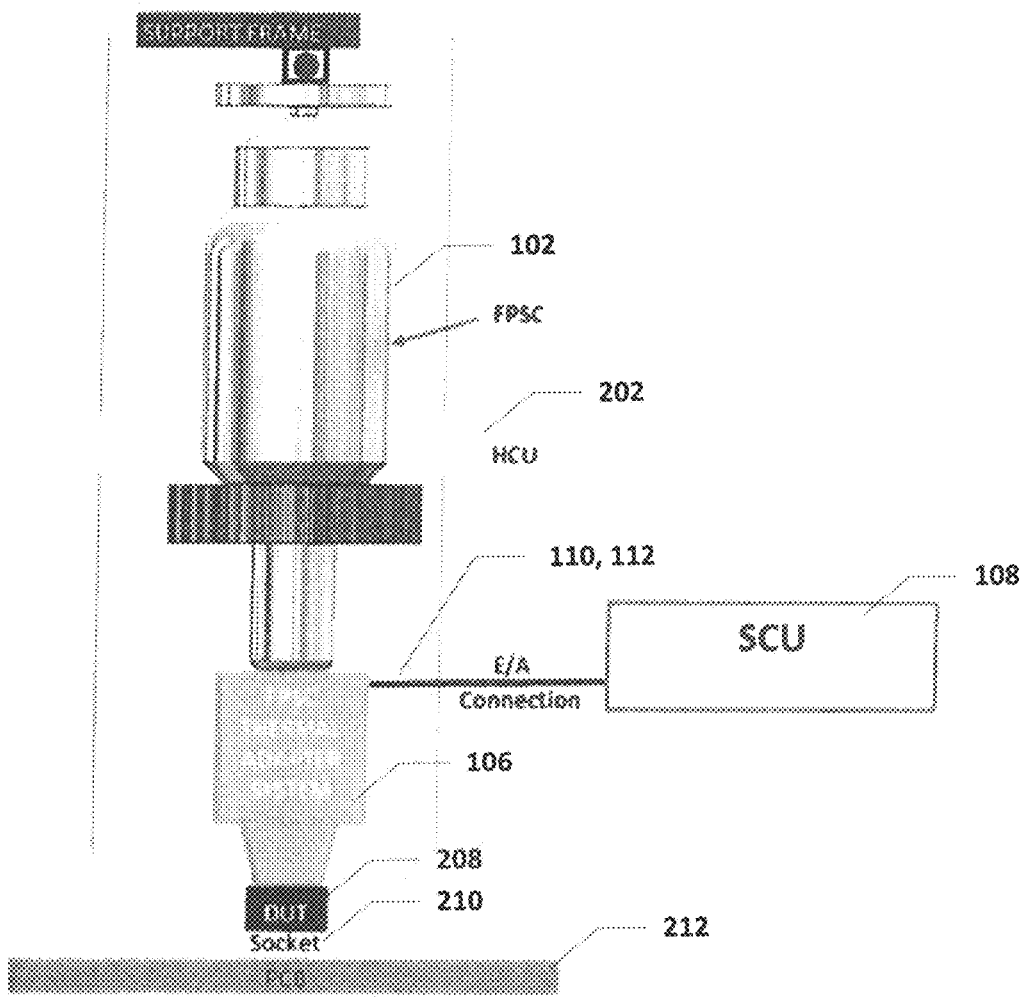
FIG. 2 is an illustration of a head control unit in a portable semiconductor cooling apparatus according to an aspect of the present disclosure.

Referring to FIG. 2, the FPSC 102 is integrated in a head control unit 202 along with the thermal adapter system 106. The FPSC produces a low temperature interface 204 at which the thermal adapter 106 is attached in order to mate with the semiconductor device under test 208. The semiconductor device under test 208 may be mounted in a socket 210 attached to a printed circuit board 212, for example. The FPSC 102 receives a thermal load from the semiconductor device under test 208 and then removes the thermal load via a heat rejection system internal to the FPSC 102.

Operating temperatures and electrical power of the FPSC 102 is directly monitored and controlled by the system control unit 108.

According to an aspect of the present disclosure, for the FPSC may be used for raising the temperature of the semiconductor device under test 208. While raising the temperature of the semiconductor device under test 208, the adapter mating condition can be minimized, thereby reducing unnecessary heat load to the FPSC 102.

The minimization of mating condition is directly related to the effective physical contact area between the FPSC and lower thermal adapter. By achieving partial separation at this interface, i.e., via a clutch type engagement, the net heat transfer to the FPSC can he reduced and/or controlled.

Figure 3:
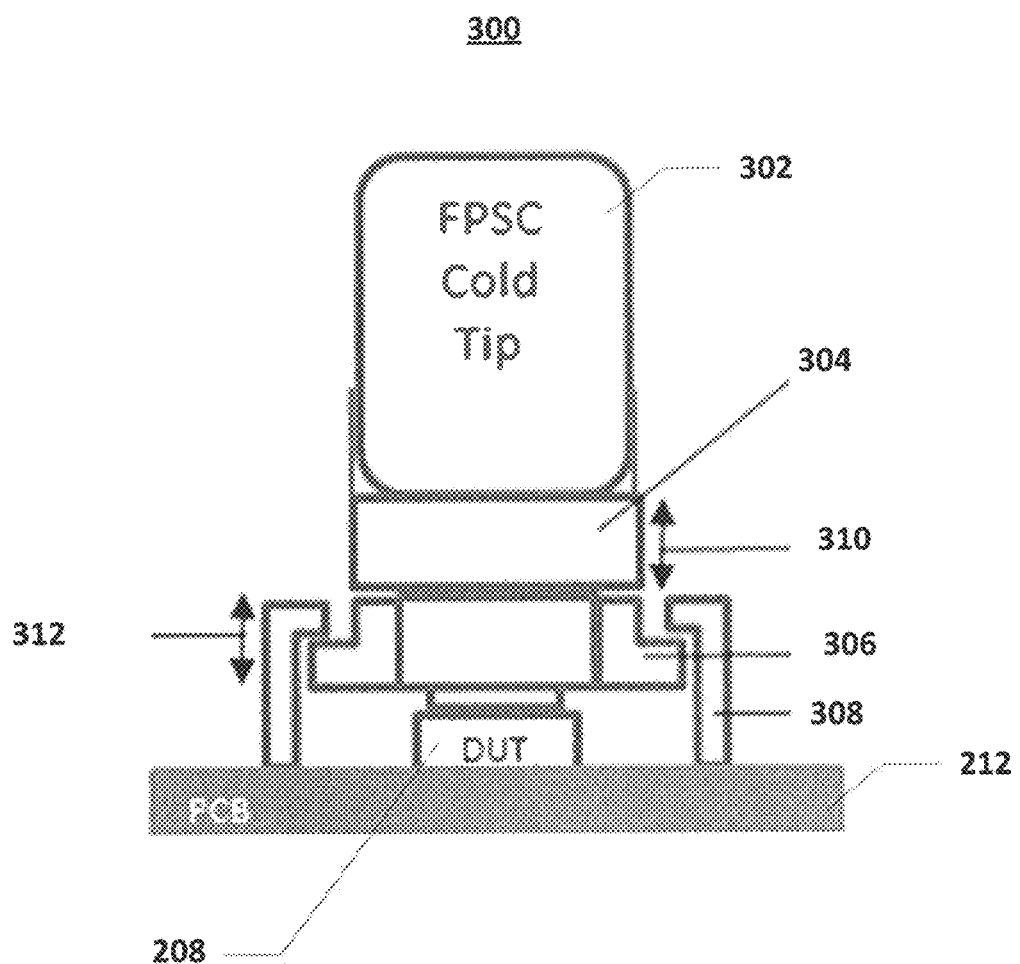
FIG. 3 is a schematic illustration of a thermal adapter system according to an aspect of the present disclosure.

FIG. 3, illustrates pressure actuations in a thermal adapter system 300 according to an aspect of the present disclosure. The thermal adapter system 300 includes an upper thermal adapter 304 coupled to an FPSC cold tip 302, a lower thermal adapter 306 and a socket 308. The socket comes 308 in contact with the printed circuit board 212 and at least partially surrounds the device under test 208. According to an aspect of the present disclosure, the thermal adapter system 300 is configured to provide a clutch actuation 310 between the upper thermal adapter 304 and the lower thermal adapter 306, and to provide a socket actuation 312 between the lower thermal adapter 306 and the socket 308.

For heating the device under test, that is, supplying additional heat from heater elements located in the thermal adapter itself (to achieve device temperatures typically in the range 125 to 150 C.), the clutch action can minimize the thermal losses to the FPSC (which is typically cold and thus a thermal short to the heating effort). In the same way, the clutch also works when controlling cooling the device under test. An FPSC is safely rated per heat capacity for design thermal dissipation and this must be maintained for safe control.

Figure 4:
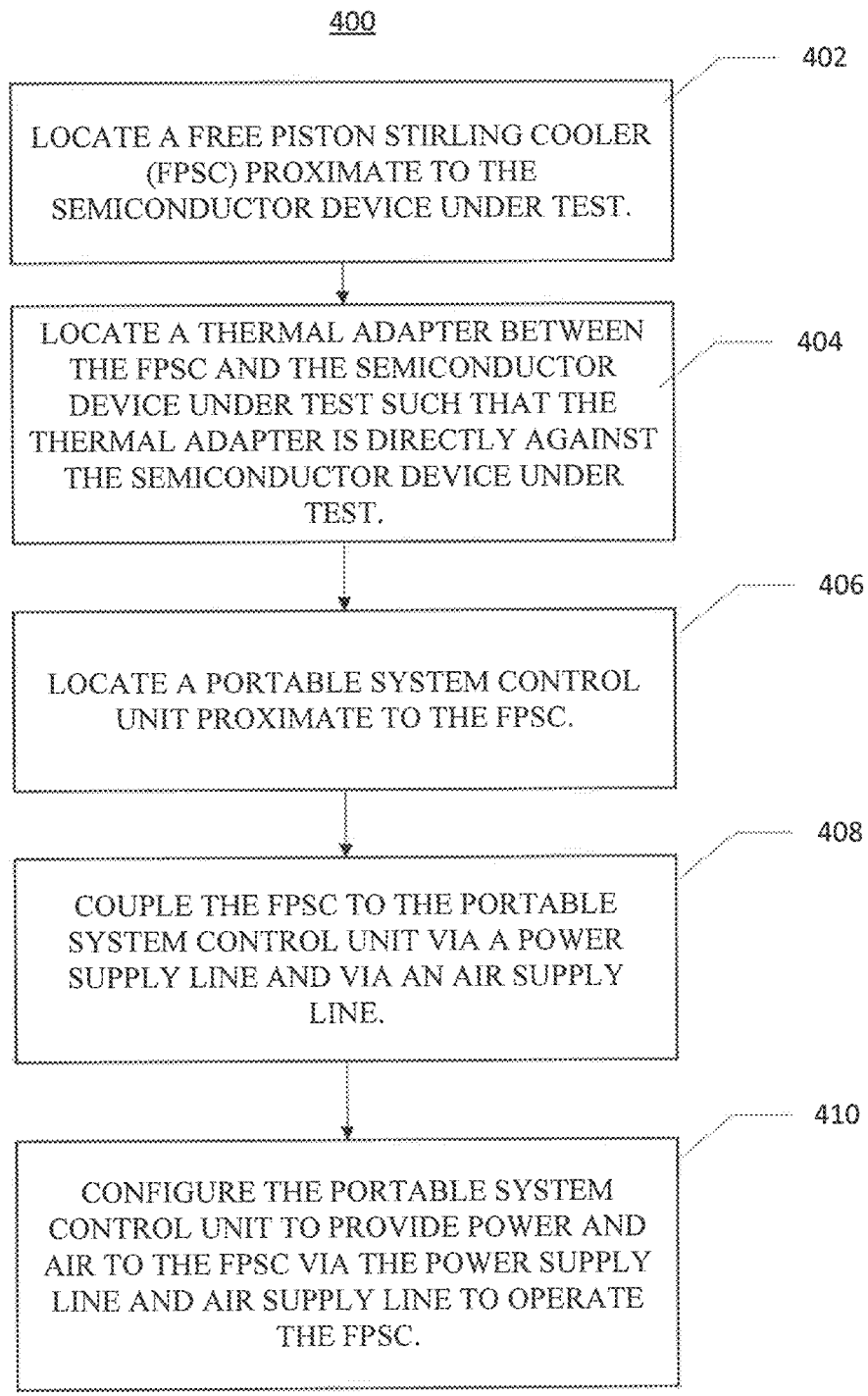
FIG. 4 is a process flow diagram illustrating a method for cooling a semiconductor device under test according to an aspect of the present disclosure.

A method of cooling a semiconductor device under test according to an aspect of the present disclosure is described with reference to FIG. 4. The method 400 includes locating a free piston Stirling cooler (FPSC) proximate to the semiconductor device under test at block 402. At block 404, the method includes locating a thermal adapter between the FPSC and the semiconductor device under test such that the thermal adapter is directly against the semiconductor device under test. At block 406, the method includes locating a portable system control unit proximate to the FPSC. At block 408, the method includes coupling the FPSC to the portable system control unit via a power supply line and via an air supply line. At block 410, the method includes configuring the portable system control unit to provide power and air to the FPSC via the power supply line and air supply line to operate the FPSC.

In an illustrative embodiment, the operation of the FPSC provides cooling of the semiconductor device under test. In an illustrative embodiment, the cooling may be performed to reduce a temperature of the semiconductor device below −100° C. In another embodiment, the method may include heating the semiconductor device under test by the operation of the FPSC.

The method may also include configuring the portable system control unit to monitor an operating condition of the FPSC. Monitoring the operating condition may include monitoring a temperature of the FPSC proximate to the thermal adapter, and monitoring voltages on the electrical power line, for example.

The disclosed portable cooling system is more compact than conventional semiconductor cooling systems and can be entirely located near the semiconductor device under test. The disclosed portable temperature control apparatus is less cumbersome allows faster system and startup than conventional semiconductor cooling systems and can reach cryogenic temperatures in only two to three minutes. Compact integration of the cooling system hardware near the semiconductor device under test eliminates lengthy hose connections to a remote components and controller chassis. This can reduce or eliminate risk of coolant leakage associated with standard test setups that involve fluid system hookups.

The foregoing description of embodiments is intended to provide illustration and description but is not intended to be exhaustive or to limit the invention to the precise form disclosed. Modifications and variations are possible in light of the above teachings or may be acquired from practice of the invention.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A portable semiconductor cooling apparatus, comprising:
    a free piston stirling cooler (FPSC);
    a support member configured for locating the FPSC directly over a semiconductor device under test in a vertical orientation; and
    a thermal adapter coupled to the FPSC and configured for coupling to the semiconductor device under test.

2. The apparatus of claim 1, comprising a portable system control unit coupled to the free piston stirling cooler.

3. The apparatus of claim 2, comprising an electrical power line extending between the portable system control unit and the FPSC.

4. The apparatus of claim 3, comprising an air supply line extending between the portable system control unit and the FPSC.

5. The apparatus of claim 4, wherein the electrical power line and the air supply line are supported by the support member.

6. The apparatus of claim 1, comprising an adjustable support frame including the support member, the adjustable support frame configured for locating and orienting the FPSC in a fixed location proximate to the semiconductor device under test.

7. The apparatus of claim 6, wherein the FPSC is suspended vertically above the semiconductor under test.

8. The apparatus of claim 7, comprising:
    a support frame base coupled to the adjustable support frame, the support frame base including a system control unit support structure; and
    a system control unit supported by the system control unit support structure.

9. The apparatus of claim 8, comprising an electrical power line and an air supply line extending from the FPSC to the system control unit via a cable path within the adjustable support frame.

10. A portable semiconductor cooling apparatus, comprising:
    a free piston stirling cooler (FPSC);
    a support member configured for locating the FPSC directly over a semiconductor device under test;
    a thermal adapter coupled to the FPSC and configured for coupling to the semiconductor device under test;
    a portable system control unit coupled to the free piston stirling cooler via an electrical power line extending between the portable system control unit and the FPSC and via an air supply line extending between the portable system control unit and the FPSC wherein the electrical power line and the air supply line are supported by the support member;
    an adjustable support frame including the support member, the adjustable support frame configured for locating and orienting the FPSC in a fixed location proximate to the semiconductor device under test;
    a support frame base coupled to the adjustable support frame, the support frame base including a system control unit support structure; and
    a system control unit supported by the system control unit support structure.

11. A method of cooling a semiconductor device under test, the method comprising:
    locating a free piston stirling cooler (FPSC) proximate to the semiconductor device under test;
    locating a thermal adapter between the FPSC and the semiconductor device under test such that the thermal adapter is directly against the semiconductor device under test;
    locating a portable system control unit proximate to the FPSC;
    coupling the FPSC to the portable system control unit via a power supply line and via an air supply line; and
    configuring the portable system control unit to provide power and air to the FPSC via the power supply line and air supply line to operate the FPSC.

12. The method of claim 11, further comprising configuring the portable system control unit to monitor an operating condition of the FPSC.

13. The method of claim 12, wherein monitoring the operating condition comprises monitoring a temperature of the FPSC proximate to the thermal adapter.

14. The method of claim 11, comprising cooling the semiconductor device under test by the operation of the FPSC.

15. The method of claim 14, wherein the cooling is performed to reduce a temperature of the semiconductor device below −100° C.

16. The method of claim 11, comprising heating the semiconductor device under test by the operation of the FPSC.

* * * * *